(12) United States Patent
Kinstler et al.

(10) Patent No.: US 8,122,600 B2
(45) Date of Patent: Feb. 28, 2012

(54) FAN AND COMPRESSOR BLADE DOVETAIL RESTORATION PROCESS

(75) Inventors: Monika D. Kinstler, Glastonbury, CT (US); David A. Rutz, Glastonbury, CT (US); Robert L. Memmen, Cheshire, CT (US)

(73) Assignee: United Technologies Corporation, Hartford, CT (US)

( * ) Notice: Subject to any disclaimer, the term of this patent is extended or adjusted under 35 U.S.C. 154(b) by 1182 days.

(21) Appl. No.: 10/377,954

(22) Filed: Mar. 3, 2003

(65) Prior Publication Data

US 2004/0172827 A1 Sep. 9, 2004

(51) Int. Cl.
*B23P 6/00* (2006.01)

(52) U.S. Cl. .......... 29/889.1; 29/402.07; 29/402.04; 29/402.13; 228/119

(58) Field of Classification Search .......... 29/889.1, 29/402.07, 402.8, 402.04, 402.13; 228/119; 416/213 R, 204 A, 210 R, 210 A, 241 R
See application file for complete search history.

(56) References Cited

U.S. PATENT DOCUMENTS

| | | | | |
|---|---|---|---|---|
| 3,574,924 A | * | 4/1971 | Dibble | 228/119 |
| 3,791,852 A | * | 2/1974 | Bunshah | 427/567 |
| 4,285,459 A | | 8/1981 | Baladjanian et al. | |
| 4,705,203 A | * | 11/1987 | McComas et al. | 228/119 |
| 4,819,313 A | * | 4/1989 | Dadhich | 29/889.22 |
| 4,822,248 A | | 4/1989 | Wertz et al. | |
| 4,929,322 A | * | 5/1990 | Sue et al. | 204/192.38 |
| 4,940,390 A | | 7/1990 | Amos et al. | |
| 4,988,534 A | * | 1/1991 | Upadhya | 427/576 |
| 5,451,142 A | | 9/1995 | Cetel et al. | |
| 5,490,764 A | * | 2/1996 | Schilling | 416/239 |
| 5,525,429 A | | 6/1996 | Mannava et al. | |
| 5,551,840 A | * | 9/1996 | Benoit et al. | 416/241 B |
| 5,573,604 A | * | 11/1996 | Gerdes | 148/237 |
| 5,603,603 A | * | 2/1997 | Benoit et al. | 415/173.4 |
| 5,732,467 A | | 3/1998 | White et al. | |
| 5,735,044 A | * | 4/1998 | Ferrigno et al. | 29/889.1 |
| 5,783,318 A | | 7/1998 | Biondo et al. | |
| 5,823,745 A | * | 10/1998 | Anderson et al. | 416/213 R |
| 6,049,978 A | | 4/2000 | Arnold | |
| 6,049,979 A | * | 4/2000 | Nolan et al. | 29/889.1 |
| 6,065,344 A | * | 5/2000 | Nolan et al. | 73/629 |
| 6,085,417 A | * | 7/2000 | Anderson et al. | 29/889.1 |
| 6,375,423 B1 | * | 4/2002 | Roberts et al. | 416/2 |
| 6,490,791 B1 | * | 12/2002 | Surace et al. | 29/889.1 |
| 6,905,578 B1 | * | 6/2005 | Moslehi et al. | 204/192.12 |
| 2002/0045053 A1 | * | 4/2002 | Hoskin | 428/469 |
| 2002/0064460 A1 | * | 5/2002 | Chien | 416/223 R |
| 2002/0066770 A1 | | 6/2002 | Seth et al. | |
| 2002/0076573 A1 | * | 6/2002 | Neal et al. | 428/621 |
| 2002/0194733 A1 | * | 12/2002 | Surace et al. | 29/889.1 |
| 2003/0086765 A1 | * | 5/2003 | Nolan et al. | 407/13 |
| 2005/0000444 A1 | * | 1/2005 | Hass et al. | 118/723 EB |

FOREIGN PATENT DOCUMENTS

| | | |
|---|---|---|
| EP | 1 153 699 | 11/2001 |
| JP | 4-287801 | 10/1992 |

* cited by examiner

*Primary Examiner* — Essama Omgba
(74) *Attorney, Agent, or Firm* — Bachman & LaPointe, P.C.

(57) ABSTRACT

A method for restoring blade dovetails to their original shape comprising the steps of removing damaged material from a blade dovetail at a damage site, physically depositing a metal at the damage site in an amount sufficient to replace the removed damaged material, and machining the blade dovetail to the original shape.

11 Claims, 1 Drawing Sheet

FAN AND COMPRESSOR BLADE DOVETAIL RESTORATION PROCESS

BACKGROUND OF THE INVENTION (1) Field of the Invention

The present invention relates to a method for restoring compressor blade dovetails. More specifically, the present invention relates to a method of physically depositing parent metal onto a fretted or galled blade dovetail so as to restore the blade to operating condition.

(2) Description of Related Art

With reference to FIG. 1, there is illustrated a compressor disk and compressor blades assembly known to the art. Compressor disk 11 comprises a plurality of compressor disk dovetail slots 15 into which are inserted a plurality of compressor blades 13. The same assembly is used as well with fan disks and fan blades. With reference to FIG. 2, there is illustrated in greater detail the mating surfaces of the compressor blades 13, and the compressor disk 11. Fan and compressor blade 13 dovetail contact surfaces 19 are commonly subject to fretting, galling or wear in service due to contact with the mating surfaces 17 of fan and compressor disk dovetail slots 15. This damage frequently renders the blades 13 unsuitable for further service.

To inhibit such damage, lubricious anti-galling materials 21 are often applied to the dovetail contact surfaces 19. Such anti-galling materials 21 include, but are not limited to aluminum-bronze and copper-nickel or copper-nickel-indium materials. However, anti-galling materials 21 often suffer wear after extended use resulting in damage to the metallic structure of the blades 13. While it is common practice to reapply anti-galling materials 21 in such an event, there is little that can be done to replace or repair damage to the metallic structure of the blades 13. If sufficient damage has been done to the metallic structure of the blades 13, the blade must be disposed of in order to avoid system failure when in use.

What is therefore needed is a method of restoring blades 13 exhibiting damage resulting from fretting and galling to their original condition.

SUMMARY OF THE INVENTION

Accordingly, it is an object of the present invention to provide a method of physically depositing parent metal onto a fretted or galled blade dovetail so as to restore the blade to operating condition In accordance with the present invention, a method for restoring blade dovetails to their original shape comprises the steps of removing damaged material from a blade dovetail at a damage site, physically depositing a parent metal at the damage site in an amount sufficient to replace the removed damaged material, and machining the blade dovetail to the original shape.

DETAILED DESCRIPTION OF THE PREFERRED EMBODIMENT(S)

Figure 1:
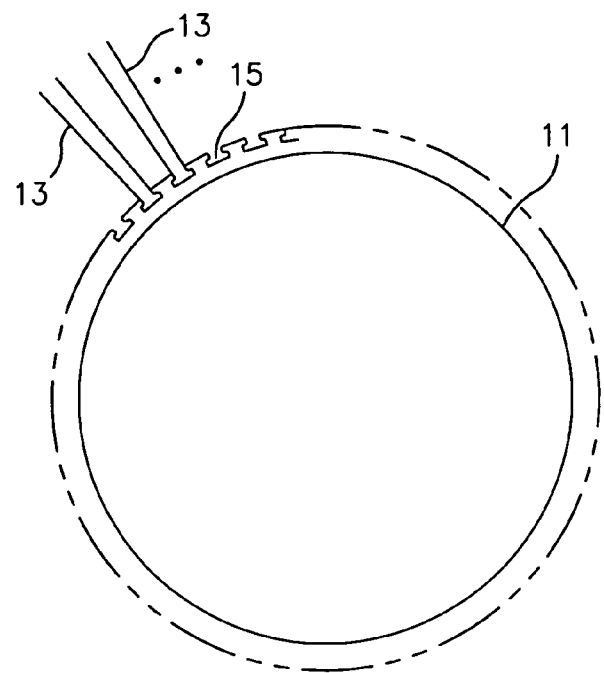
FIG. 1 A diagram of a compressor disk, blades, and blade dovetails of the present invention.
Figure 2:
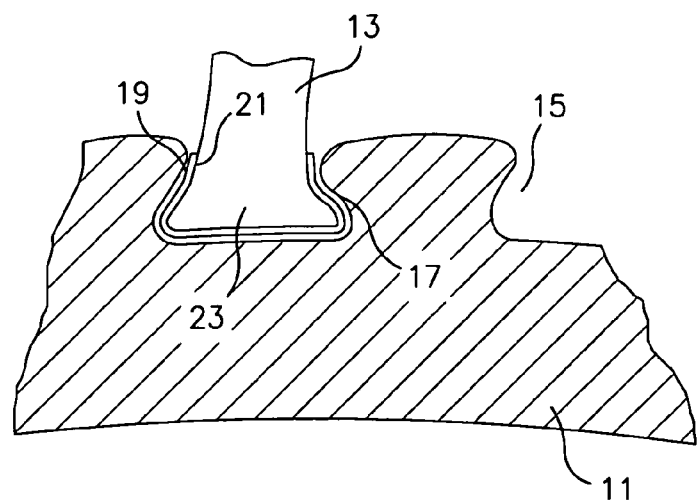
FIG. 2 A detailed illustration of the blade dovetail interface.

It is a central feature of the present invention to employ a method whereby material having near parent material chemistry and near parent metal properties is applied to the dovetails 23 of damaged fan and/or compressor blades 13 so as to restore the blades 13 to operating condition. As used herein, "parent material composition" refers to a material added to the dovetails 23 that is substantially similar to the material out of which the dovetail 23 is constructed. "Near parent" material refers to a metal possessing similarity to the dovetail construction material sufficient to meet the structural requirements of the blade.

The process of the present invention whereby there is dimensionally restored damaged contact surfaces 19 is as follows. First, damaged dovetail contact surfaces 19 are inspected, and damaged material (if present) is removed by machining or grinding. Machining proceeds to a depth sufficient to fully eradicate surface distress. Typically, the depth required to achieve such eradication is between approximately five and ten mils. Preferably, machining continues to approximately two mils beyond full eradication.

Second, material having an alloy content similar to the blade material is applied to the damaged dovetail contact surface 19 at the site of damage using either cathodic arc vapor deposition or electron beam physical vapor deposition (EBPVD). In a preferred embodiment, a variant of EBPVD is utilized wherein ion enhancement is employed to accelerate the vapor particles and increase the bond strength of the coating. In a preferred embodiment, when restoring fan blades, the alloy used is a Ti-6Al-4V alloy (i.e. Ti6-4) or other alloy of lower aluminum content. In the case of alloys containing Mo or other refractory elements, as are preferably used to restore compressor blades, a third process, electron beam flash vapor deposition, may be utilized. In such an instance, a Ti-8Al-1V-1Mo alloy is preferably employed. In a preferred embodiment, the alloy employed is identical to the material out of which the dovetail is fashioned. In another preferred embodiment, Ti6-4 can be deposited onto a substrate of a different titanium alloy.

Preferably, vapor deposition is performed at a process pressure of between $10^{-3}$ and $10^{-6}$ torr. More preferably, the process pressure is approximately $10^{-4}$ torr. Preferably, the rate of deposition is between 10 and 50 micrometers per minute. Most preferably, the rate of deposition is approximately 20 micrometers per minute.

After deposition has been performed, contact surfaces 19 are machined or ground to their original shape. Any coatings, required by the original equipment manufacturer are applied to the blade dovetail 23. Preferably, anti-galling materials such as those recited above are applied to the blade dovetails.

After the physical vapor deposition process has been performed, the dovetail 23 may be shot peened. Shot peening is a method whereby metal beads, usually steel beads, are shot at high velocity to impact with the surface of a target object. Such repeated impacting results in a compressed surface layer increasing the ability of the dovetail 23 to resist surface cracks which give rise to structural failure.

It is apparent that there has been provided in accordance with the present invention a method of physically depositing metal onto a distressed blade dovetail so as to restore the blade to operating condition which fully satisfies the objects, means, and advantages set forth previously herein. While the present invention has been described in the context of specific embodiments thereof, other alternatives, modifications, and variations will become apparent to those skilled in the art having read the foregoing description. For example, extension of the teachings of the present invention to encompass physically depositing metal onto any damaged machined part, particularly parts machined of titanium alloys, is encompassed in the present disclosure. Accordingly, it is intended to embrace those alternatives, modifications, and variations as fall within the broad scope of the appended claims.

What is claimed is:

1. A method for restoring blade dovetails to their original shape comprising the steps of:
   removing damaged material only from a contact surface of a blade dovetail at a damage site;
   said removing step comprising removing said damaged material to a depth sufficient to fully eradicate surface distress;
   restoring said contact surface by performing vapor deposition of a metal only at said damage site on said contact surface in an amount sufficient to replace said removed damaged material;
   said vapor deposition performing step comprising depositing a metal having near parent material chemistry and near parent material properties; and
   machining said blade dovetail to said original shape,
   wherein said performing vapor deposition of said metal is performed at a rate between 10 and 50 micrometers per minute,
   wherein said removing said damaged material comprises the step of machining said dovetail to an approximate depth between five and fifteen mils; and
   performing the additional step of shot peening said blade dovetail.

2. The method of claim 1 comprising the additional step of applying an anti-galling material to a surface of said machined dovetail.

3. The method of claim 2 wherein said applying said anti-galling material comprises applying an anti-galling material selected from the group consisting of aluminum-bronze, copper-nickel, and copper-nickel-indium.

4. The method of claim 1 wherein said removing damaged material from said blade dovetail comprises removing material from a blade dovetail selected from the group consisting of compressor blade dovetails and fan blade dovetails.

5. The method of claim 1 wherein said performing vapor deposition comprises performing physical vapor deposition in a manner selected from the group consisting of cathodic arc vapor deposition, electron beam physical vapor deposition, and electron beam flash vapor deposition.

6. A method for restoring blade dovetails to their original shape comprising the steps of:
   removing damaged material only from a contact surface of a blade dovetail at a damage site;
   said removing step comprising removing said damaged material to a depth sufficient to fully eradicate surface distress;
   restoring said contact surface by performing vapor deposition of a metal only at said damage site on said contact surface in an amount sufficient to replace said removed damaged material;
   said vapor deposition performing step comprising depositing a metal having near parent material chemistry and near parent material properties;
   machining said blade dovetail to said original shape,
   wherein said performing vapor deposition of said metal comprises physically depositing a metal consisting of Ti-8Al-1V-1Mo; and
   wherein said performing vapor deposition of said metal is performed at a rate between 10 and 50 micrometers per minute.

7. A method for restoring blade dovetails to their original shape comprising the steps of:
   removing damaged material only from a contact surface of a blade dovetail at a damage site;
   said removing step comprising removing said damaged material to a depth sufficient to fully eradicate surface distress;
   restoring said contact surface by performing vapor deposition of a metal only at said damage site on said contact surface in an amount sufficient to replace said removed damaged material;
   said vapor deposition performing step comprising depositing a metal having near parent material chemistry and near parent material properties; and
   machining said blade dovetail to said original shape,
   wherein said performing vapor deposition comprises performing physical vapor deposition in a manner selected from the group consisting of cathodic arc vapor deposition, electron beam physical vapor deposition, and electron beam flash vapor deposition; and
   wherein said performing said performing vapor deposition is performed at a pressure between $10^{-3}$ and $10^{-6}$ torr; and
   wherein said performing vapor deposition of said metal is performed at a rate between 10 and 50 micrometers per minute.

8. The method of claim 7 wherein said performing said performing vapor deposition is performed at a pressure of approximately $10^{-4}$ torr.

9. The method of claim 7 wherein said performing vapor deposition of said metal is performed at a rate of approximately 20 micrometers per minute.

10. The method of claim 7, wherein said performing vapor deposition of said metal comprises physically depositing a metal selected from the group consisting of Ti-6Al-4V and Ti-8Al-1V-1Mo.

11. The method of claim 7, wherein said performing vapor deposition of said metal comprises physically depositing one of Ti-6Al-4V and a titanium alloy different than Ti-6Al-4V.

* * * * *